US012628688B2

(12) United States Patent
Herbst

(10) Patent No.: US 12,628,688 B2
(45) Date of Patent: May 12, 2026

(54) POWER SEMICONDUCTOR MODULE ARRANGEMENT AND HOUSING FOR A POWER SEMICONDUCTOR MODULE ARRANGEMENT

(71) Applicant: Infineon Technologies AG, Neubiberg (DE)

(72) Inventor: Thomas Herbst, Arnsberg (DE)

(73) Assignee: Infineon Technologies AG, Neubiberg (DE)

( * ) Notice: Subject to any disclaimer, the term of this patent is extended or adjusted under 35 U.S.C. 154(b) by 857 days.

(21) Appl. No.: 17/714,625

(22) Filed: Apr. 6, 2022

(65) Prior Publication Data

US 2022/0328368 A1      Oct. 13, 2022

(30) Foreign Application Priority Data

Apr. 7, 2021    (EP) ..................................... 21167227

(51) Int. Cl.
H01L 23/498        (2006.01)
H01L 23/053        (2006.01)
(Continued)

(52) U.S. Cl.
CPC ...... H01L 23/053 (2013.01); H01L 23/49811 (2013.01); H01L 25/072 (2013.01); H01L 25/18 (2013.01)

(58) Field of Classification Search
CPC ............. H01L 23/053; H01L 23/49811; H01L 25/072; H01L 25/18; H01L 25/50; H01L 24/29; H01L 24/32; H01L 24/48; H01L 24/73; H01L 2224/29101; H01L 2224/29339; H01L 2224/32225; H01L 2224/45014; H01L 2224/48091; H01L 2224/48227; H01L 2224/73265; H01L 2224/83801; H01L 2224/8384;
(Continued)

(56) References Cited

U.S. PATENT DOCUMENTS 5,641,713 A      6/1997   Kyle
10,763,468 B2    9/2020   Bedjaoui et al.
(Continued)

FOREIGN PATENT DOCUMENTS

JP        H08274204 A      10/1996
KR        20050042373 A      5/2005

*Primary Examiner* — Elias Ullah
(74) *Attorney, Agent, or Firm* — Murphy, Bilak & Homiller, PLLC

(57) ABSTRACT

A power semiconductor module arrangement includes a housing, at least one substrate arranged inside the housing and including a dielectric insulation layer and a first metallization layer arranged on a first side of the dielectric insulation layer, and a heat sink or base plate. The housing includes sidewalls and a cover and is attached to the heat sink or base plate. The sidewalls exert pressure on the at least one substrate such that the at least one substrate is pressed onto the heat sink or base plate. The cover exerts pressure on the sidewalls such that the sidewalls are pressed onto the at least one substrate. The housing further includes at least one press-on element arranged between and directly adjoining the sidewalls and the cover, wherein each of the at least one press-on element is compressed by the pressure that is exerted on the sidewalls by the cover.

15 Claims, 4 Drawing Sheets

(51) Int. Cl.
*H01L 25/07* (2006.01)
*H01L 25/18* (2023.01)

(58) Field of Classification Search
CPC ......... H01L 2924/00014; H01L 23/041; H01L
23/10; H01L 23/04
See application file for complete search history.

(56) References Cited

U.S. PATENT DOCUMENTS

| | | | |
|---|---|---|---|
| 2005/0139990 A1 | 6/2005 | Kim | |
| 2009/0104734 A1* | 4/2009 | Specht ................ | H01L 21/4817 |
| | | | 438/117 |
| 2012/0106086 A1* | 5/2012 | Schloerke ............... | H01L 23/24 |
| | | | 361/728 |
| 2018/0337108 A1* | 11/2018 | Walter ............... | H05K 7/20854 |
| 2020/0091023 A1 | 3/2020 | Nottelmann et al. | |

* cited by examiner

POWER SEMICONDUCTOR MODULE ARRANGEMENT AND HOUSING FOR A POWER SEMICONDUCTOR MODULE ARRANGEMENT

TECHNICAL FIELD

The instant disclosure relates to a power semiconductor module arrangement and to a housing for a power semiconductor module arrangement, in particular to a power semiconductor module arrangement including a housing that comprises several parts.

BACKGROUND

Power semiconductor module arrangements often include one or more substrates within a housing. Each substrate usually comprises a substrate layer (e.g., a ceramic layer), a first metallization layer deposited on a first side of the substrate layer and, optionally, a second metallization layer deposited on a second side of the substrate layer. A semiconductor arrangement including one or more controllable semiconductor elements (e.g., two IGBTs in a half-bridge configuration) may be arranged on the at least one substrate. The housing often comprises several separate pails such as sidewalls and a cover. The at least one substrate can be arranged on a heat sink, and the sidewalls of the housing can press the at least one substrate onto the heatsink to provide optimal heat dissipation. The sidewalls can be attached to the heatsink, e.g., by means of screws or other suitable connection elements. The cover of the housing is mounted onto the sidewalls and connected to the heatsink, thereby pressing the sidewalls and the at least one substrate arranged in the housing onto the heatsink. There is a risk, however, that the forces that are exerted on the sidewalls and on the at least one substrate are distributed unequally. This may negatively affect the heat dissipation.

There is a need for a power semiconductor module arrangement and a housing for a power semiconductor module arrangement that provide a homogenous distribution of the forces exerted on the sidewalls of the housing and on the at least one substrate that is arranged inside the housing.

SUMMARY

A power semiconductor module arrangement includes a housing, at least one substrate arranged inside the housing and including a dielectric insulation layer, and a first metallization layer arranged on a first side of the dielectric insulation layer, and a heat sink or base plate, wherein the housing includes sidewalls and a cover, the housing is attached to the heat sink or base plate, the sidewalls of the housing exert pressure on the at least one substrate, thereby pressing the at least one substrate onto the heat sink or base plate, the cover exerts pressure on the sidewalk, thereby pressing the sidewalls onto the at least one substrate, and the housing further includes at least one press-on element arranged between and directly adjoining the sidewalls and the cover, wherein each of the at least one press-on element is compressed by the pressure that is exerted on the sidewalls by the cover.

A method includes arranging at least one substrate on a heat sink or base plate, wherein each of the at least one substrate includes a dielectric insulation layer, and a first metallization layer arranged on a first side of the dielectric insulation layer, arranging a housing on the at least one substrate, wherein the housing includes sidewalk, a cover, and at least one press-on element, and wherein arranging the housing on the at least one substrate includes arranging the sidewalk on the at least one substrate such that the sidewalls extend along an outer circumference of the at least one substrate, arranging the cover on the sidewalks such that the at least one press-on element is arranged between and directly adjoins the sidewalk and the cover, and attaching the housing to the heat sink or base plate, wherein, when the housing is attached to the heat sink or base plate, the sidewalk of the housing exert pressure on the at least one substrate, thereby pressing the at least one substrate onto the heat sink or base plate, the cover exerts pressure on the sidewalk, thereby pressing the sidewalls onto the at least one substrate, and each of the at least one press-on element is compressed by the pressure that is exerted on the sidewalls by the cover.

A housing includes sidewalls, a cover, and at least one press-on element arranged between and directly adjoining the sidewalk and the cover, wherein each of the at least one press-on element is compressed when pressure s exerted on the sidewalls by the cover.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

BRIEF DESCRIPTION OF THE DRAWINGS

FIGS. 11A and 11B illustrate a flexible element of the housing of FIG. 10 in an initial position (FIG. 11A) and in a compressed state (FIG. 11B).

FIGS. 13A and 13B illustrate a flexible element of the housing of FIG. 12 in an initial position (FIG. 13A) and in a compressed state (FIG. 13B).

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as "first element", "second element", "third element" etc. are not to be understood as enumerative. Instead, such desig- nations serve solely to address different "elements". That is, e.g., the existence of a "third element" does not require the existence of a "first element" and a "second element". A semiconductor body as described herein may be made from (doped) semiconductor material and may be a semiconduc- tor chip or may be included in a semiconductor chip. A semiconductor body has electrically connecting pads and includes at least one semiconductor element with electrodes.

Figure 1:
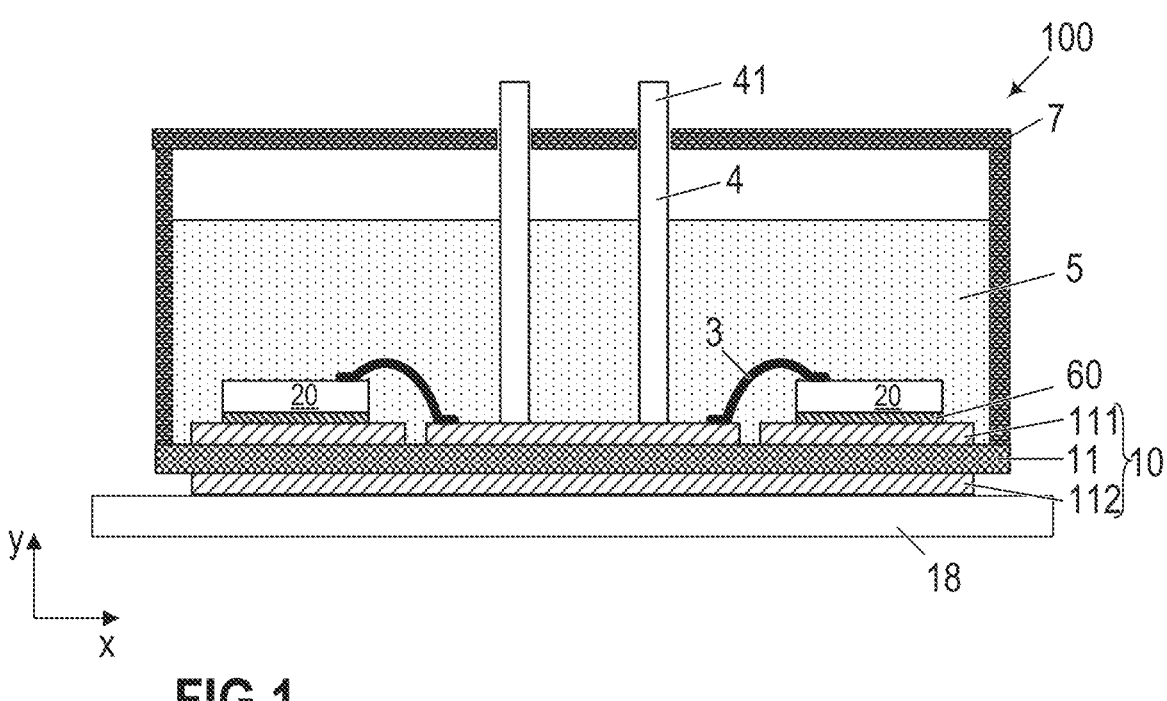
FIG. 1 is a cross-sectional view of a power semiconductor module arrangement.

Referring to FIG. 1, a cross-sectional view of a power semiconductor module arrangement 100 is illustrated. The power semiconductor module arrangement 100 includes a housing 7 and a substrate 10. The substrate 10 includes a dielectric insulation layer 11, a (structured) first metalliza- tion layer 111 attached to the dielectric insulation layer 11, and a (structured) second metallization layer 112 attached to the dielectric insulation layer 11. The dielectric insulation layer 11 is disposed between the first and second metalliza- tion layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement. The sub- strate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. Alternatively, the dielectric insulation layer 11 may consist of an organic compound and include one or more of the following materials: $Al_2O_3$, SiC, BeO, BN, or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An insulated Metal Substrate generally comprises a dielectric insulation layer 11 comprising (filled) materials such as epoxy resin or poly- imide, for example. The material of the dielectric insulation layer 11 may be filled with ceramic particles, for example. Such particles may comprise, e.g., $Si_2O$, $Al_2O_3$, AlN, SiN or BN and may have a diameter of between about 1 μm and about 50 μm. The substrate 10 may also be a conventional printed circuit board (PCB) having a non-ceramic dielectric insulation layer 11. For instance, a non-ceramic dielectric insulation layer 11 may consist of or include a cured resin.

The substrate 10 is arranged in a housing 7. In the example illustrated in FIG. 1, the substrate 10 forms a base surface of the housing 7, while the housing 7 itself solely comprises sidewalls and a cover. This, however, is only an example. It is also possible that the housing 7 further comprises a base surface and the substrate 10 is arranged on the base surface inside the housing 7. According to another example (not specifically illustrated), the substrate 10 may be mounted on a base plate. The base plate may form a bottom of the housing 7. In some power semiconductor module arrangements 100, more than one substrate 10 is arranged within the same housing 7.

One or more semiconductor bodies 20 may be arranged on the at least one substrate 10. Each of the semiconductor bodies 20 arranged on the at least one substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable semiconductor element.

The one or more semiconductor bodies 20 may form a semiconductor arrangement on the substrate 10. In FIG. 1, only two semiconductor bodies 20 are exemplarily illus- trated. The second metallization layer 112 of the substrate 10 in FIG. 1 is a continuous layer. According to another example, the second metallization layer 112 may be a structured layer. According to other examples, the second metallization layer 112 may be omitted. The first metalliza- tion layer 111 is a structured layer in the example illustrated in FIG. 1. "Structured layer" in this context means that the respective metallization layer is not a continuous layer, but includes recesses between different sections of the layer. Such recesses are schematically illustrated in FIG. 1. The first metallization layer 111 in this example includes three different sections. Different semiconductor bodies 20 may be mounted to the same or to different sections of the first metallization layer 111. Different sections of the first met- allization layer 111 may have no electrical connection or may be electrically connected to one or more other sections using electrical connections 3 such as, e.g., bonding wires. Semiconductor bodies 20 may be electrically connected to each other or to the first metallization layer 111 using electrical connections 3, for example. Electrical connections 3, instead of bonding wires, may also include bonding ribbons, connection plates or conductor rails, for example, to name just a few examples. The one or more semiconductor dies:20 may be electrically and mechanically connected to the substrate 10 by an electrically conductive connection layer 60. Such an electrically conductive connection layer 60 may be a solder layer, a layer of an electrically conduc- tive adhesive, or a layer of a sintered metal powder, e.g., a sintered silver (Ag) powder, for example.

The power semiconductor module arrangement 100 illus- trated in FIG. 1 further includes terminal elements 4. The terminal elements 4 are electrically connected to the first metallization layer 111 and provide an electrical connection between the inside and the outside of the housing 7. The terminal elements 4 may be electrically connected to the first metallization layer 111 with a first end, while a second end 41 of the terminal elements 4 protrudes out of the housing 7. The terminal elements 4 may be electrically contacted from the outside at their second end 41. Such terminal elements 4, however, are only an example. The components inside the housing 7 may be electrically contacted from outside the housing 7 in any other suitable way. For example, terminal elements 4 may be arranged closer to or adjacent to the sidewalls of the housing 7. It is also possible that terminal elements 4 protrude vertically or horizontally through the sidewalls of the housing 7. The first end of a terminal element 4 may be electrically and mechanically connected to the substrate 10 by an electrically conductive connection layer, for example (not explicitly illustrated in FIG. 1). Such an electrically conductive connection layer may be a solder layer, a layer of an electrically conductive adhesive, or a layer of a sintered metal powder, e.g., a sintered silver (Ag) powder, for example. The first end of a terminal element 4 may also be electrically coupled to the substrate via one or more electrical connections 3, for example. For example, the second ends 41 of the terminal elements 4 may be connected to a printed circuit board (not illustrated in FIG. 1).

The power semiconductor module arrangement 100 gen- erally further includes an encapsulant 5. The encapsulant 5 may consist of or include a silicone gel or may be a rigid molding compound, for example. The encapsulant 5 may at least partly fill the interior of the housing 7, thereby covering the components and electrical connections that are arranged on the substrate 10. The terminal elements 4 may be partly embedded in the encapsulant 5. At least their second ends 41, however, are not covered by the encapsulant 5 and protrude from the encapsulant 5 through the housing 7 to the outside of the housing 7. The encapsulant 5 is configured to protect the components and electrical connections of the power semiconductor module 100, in particular the components arranged inside the housing 7, from certain environmental conditions and mechanical damage.

The at least one substrate 10 in the example illustrated in FIG. 1 is arranged on a heat sink 18. Heat that is generated during the use of the power semiconductor module arrangement is transferred from the substrate 10 to the heat sink 18. The at least one substrate 10 can be coupled to the heat sink 18 by means of a thermally conductive connection layer (not specifically illustrated in FIG. 1). In order to increase the thermal contact between the at least one substrate 10 and the heat sink 18, the housing 7 may exert a pressure on the at least one substrate 10, thereby pressing the at least one substrate 10 onto the heat sink 18. As is exemplarily illustrated in FIG. 1, when the housing 7 is mounted on the at least one substrate 10, an edge region of the at least one substrate 10 is arranged below the sidewalls of the housing 7 in a vertical direction y such that the sidewalls extend along an outer circumference of the at least one substrate. 10, and the housing 7 exerts a pressure on the edge region of the at least one substrate 10, thereby, pressing the at least one substrate 10 onto the heat sink 18. This can significantly increase the heat dissipation from the at least one substrate 10 to the heat sink 18.

Figure 2:
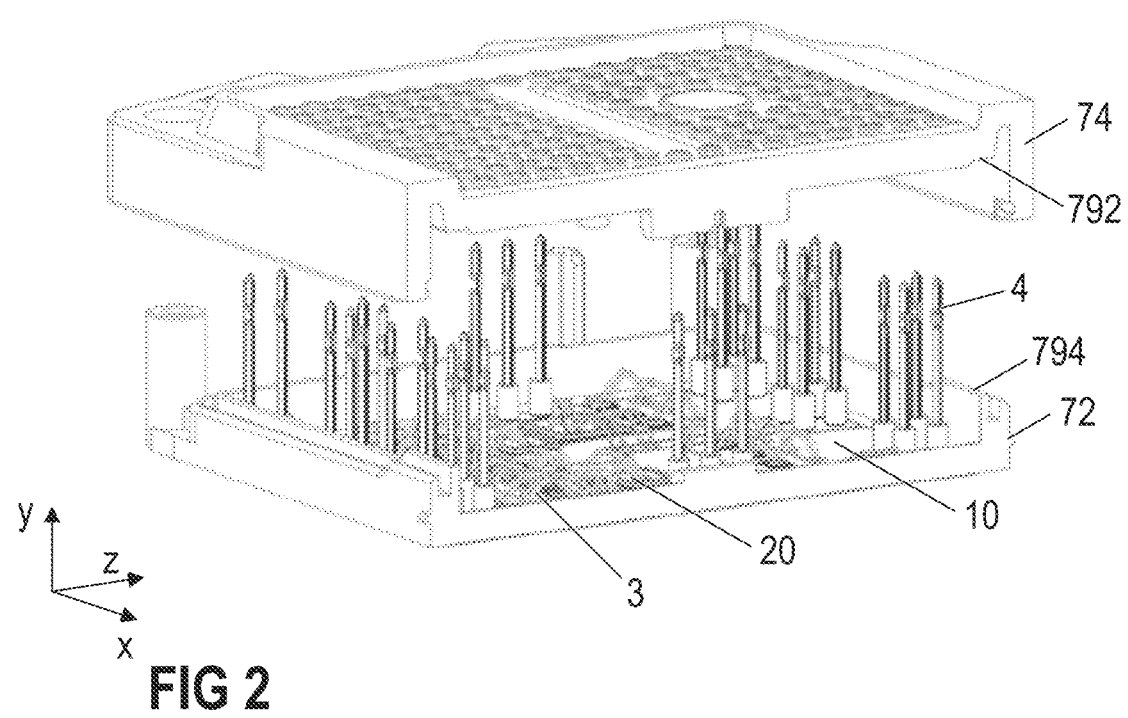
FIG. 2 is a three-dimensional view of another power semiconductor module arrangement in an unmounted state.

Now referring to FIG. 2, a three-dimensional view of a power semiconductor module arrangement is schematically illustrated. In the example of FIG. 2, the housing 7 comprises sidewalls 72 and a cover 74, wherein the cover 74 in this example is not yet mounted on the sidewalls 72. The sidewalls 72 form a closed frame. In the example illustrated in FIG. 2, the frame formed by the sidewalls 72 has a rectangular cross-section. Other cross-sections such as, e.g., a square cross-section, however are also possible. The at least one substrate 10 is arranged inside and surrounded by the frame formed by the sidewalls 72 in a horizontal plane. As has been described with respect to FIG. 1 above, the sidewalls 72 can comprise a protrusion, for example, which presses the at least one substrate on a heat sink (heat sink not specifically illustrated in FIG. 2). It is also possible that the housing comprises at least one strut 75 extending between two opposite, sidewalls (e.g., between a first (longitudinal) sidewall and a second (longitudinal) sidewall opposite the first longitudinal side). Such struts 75 can also be used to press the one or more substrates 10 onto the heat sink 18. Struts 75 are exemplarily illustrated in FIGS. 6, 7, and 8, for example.

The cover 74 in the examples described herein comprises a top part, covering an opening formed by the sidewalls 72, and side parts which extend perpendicular to the top part and parallel to the sidewalls 72 of the housing when the cover 74 is arranged to close the opening formed by the sidewalk 72. The side parts of the cover 74 extend from the top part towards the at least one substrate 10 and the heat sink. When the semiconductor module arrangement is fully assembled, the side parts may contact the sidewalk 72 and even the heat sink. For example, the side parts may be permanently coupled to the heat sink in order to fix the cover 74 in place and prevent it from moving or even falling off. For example, the cover 74 may be soldered, glued, or screwed to the heat sink 18. The side parts, however, can also be omitted.

In the example illustrated in FIG. 2, a guiding element 76 is coupled to the sidewalls 72, and the cover 74 comprises a through hole 78, The guiding element 76 can comprise a pin, for example. According to one example, the guiding element 76 may be inserted into the through hole 78 in order to correctly align the cover 74 and the sidewalls 72. In FIG. 2, the sidewalk 72 comprise one guiding element 76, and the cover 74 comprises one through hole 78. It is, however, also possible, that each of the sidewalls 72 and the cover 74 comprise more than one guiding element or through hole, respectively.

Figure 3:
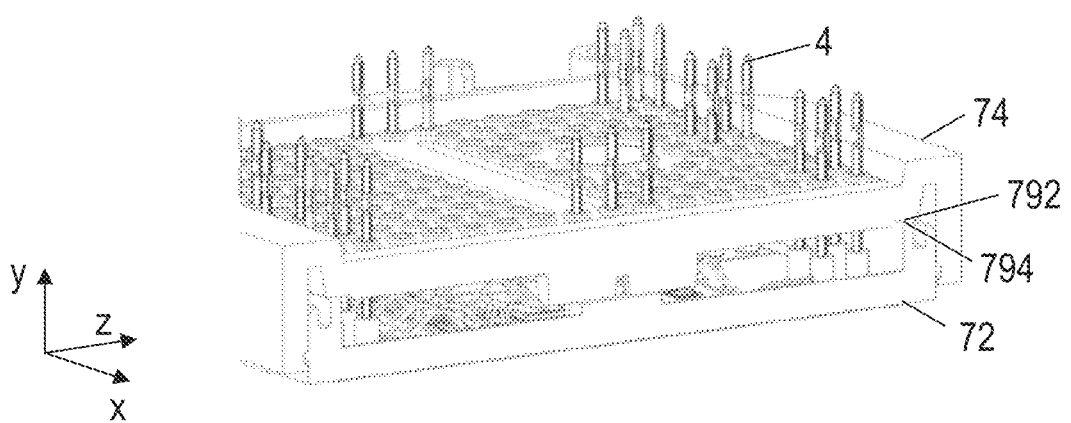
FIG. 3 is a three-dimensional view of the power semiconductor module arrangement of FIG. 2 in a mounted state.

Now referring to FIG. 3, when the cover 74 is arranged to close the opening formed by the sidewalk 72, the cover 74 exerts pressure on the sidewalls 72, thereby pressing the sidewalls 72 onto the at least one substrate 10, thereby pressing the at least one substrate 10 onto the heat sink (heat sink not specifically illustrated in FIG. 3). As is exemplarily illustrated in FIG. 3, the sidewalls 72 comprise a first contact area 792, and the cover 74 comprises a second contact area 794. When the cover 74 is mounted on the sidewalk 72 to close the opening formed by the sidewalls 72, the first contact area 792 directly contacts the second contact area 794. The first contact area 792 is formed by a surface of the sidewalks 72, in particular a surface of the sidewalls 72 which extends in parallel to the at least one substrate 10 and which forms a point of the sidewalls 7:2 that is arranged furthermost from the heat sink in the vertical direction y. The second contact area 794 is formed by a surface of the cover 74 which, when the cover 74 is mounted on the sidewalls 72 contacts the sidewalls 72 first.

Pressure that is exerted from the cover 74 to the sidewalk 72 is exerted from the second contact area 794 to the first contact area 792. In order to evenly distribute the pressure exerted by the cover 74 over the entire circumference of the frame formed by the sidewalls 72, the power semiconductor module arrangement further comprises at least one press-on element 796 arranged between the cover 74 and the sidewalls 72. This is exemplarily illustrated in FIGS. 4 to 12. Each of the at least one press-on element 796 provides a contact area for both the sidewalls 72 and the cover 74. That is, with a first end, each of the at least one press-on element 796 contacts the sidewalk 72, and with a second end, opposite the first end, each of the at least one press-on element 796 contacts the cover 74. Each of the at least one press-on element 796 is a flexible element that is compressed by the pressure that is exerted on the sidewalls 72 by the cover 74.

A press-on element 796 can be firmly or detachably attached either to the sidewalls 72 or to the cover 74. In the example illustrated in FIG. 4, a plurality of press-on elements 796 is arranged along the circumference of the frame formed by the sidewalls 72. In particular, the press-on elements 796 can be evenly distributed along the circumference. When the cover 74 is lowered onto the sidewalls 72 during the mounting process, the cover 74 comes into contact with the press-on elements 796 first. When pressure is exerted onto the sidewalk 72 by the cover 74, the press-on elements 796 are compressed. Pressure may be transferred from the cover 74 to the sidewalls 72 solely or at least mainly via the press-on elements 796. As the press-on elements 796 are flexible, pressure that is exerted by the cover 74 on the sidewalls 72 is evenly distributed along the entire circumference of the frame formed by the sidewalls 72. This is, because pressure exerted by the cover 74 is not instantly transferred to the sidewalls 72. Due to production tolerances, the cover 74 may contact different areas of the at least one press-on element 796 at different times during the mounting process. That is, the cover 74 may contact some areas of the at least one press-on element 796 first. Due to the pressure exerted by the cover 74, the respective press-on elements 796 or the respective area of the press-on element 796 are compressed. At this point, the pressure is not or only partly transferred to the sidewalk 72. Subsequently, the cover 74 contacts the remaining areas of the press-on elements 796, when the cover 74 is pressed more and more towards the sidewalls 72. Only when each of the press-on elements 796 is fully compressed, the entire pressure is transferred from the cover 74 via the press-on elements 796 to the sidewalls 72.

Attaching the at least one press-on element 796 to the sidewalls 72, however, is only an example. According to another example, and as is exemplarily illustrated in FIG. 5, it is also possible to attach the press-on elements 796 to the cover 74 instead. The effect is identical in both cases. If the press-on elements 796 are attached to the cover 74 with a first side, a second side of the press-on elements 796 opposite the first side contacts the sidewalls 72 first. The press-on elements 796 are compressed by the pressure exerted by the cover 74 onto the sidewalls 72. Only when the press-on elements 796 are entirely compressed, the full amount of the pressure is transferred to the sidewalls 72. In this way, production tolerances and irregularities of the cover 74 and the sidewalls 72 can be compensated.

The compressible press-on elements 796 can be implemented in many different ways. According to one example, each of the at least one press-on element 796 comprises an elastic material that can be compressed to a certain degree. That is, the press-on elements 796 can comprise a comparably soft material. According to one example, the at least one press-on element 796 has a hardness of between 15 Shore A and 100 Shore A. The at least one press-on element 796 can comprise at least one of a thermoplastic elastomer, silicone, and rubber. For example, the press-on elements 796 can comprise or consist of EPDM (ethylene propylene diene monomer rubber), AEM (ethylene acrylic rubber), ACM (acrylic rubber or alkyl acrylate copolymer), FKM (fluorine rubber or fluorocarbon), VMQ (silicone rubber or vinyl methyl silicone), FVMQ (fluorosilicone rubber or fluorovinylmethylsiloxane rubber), PVMQ (phenyl methyl silicone rubber), or FFKM (perfluoroelastomeric compound having a higher amount of fluorine than FKM). Other compressible materials, however, are also possible.

In an initial state, the press-on elements 796 have a first height in the vertical direction y. The initial state is the state in which no pressure is exerted on the press-on elements 796. This first height is reduced when pressure is exerted on the press-on elements 796. According to one example, the first height of the press-on elements 796 is reduced by 10-70% as compared to the initial state.

According to one example, each of the at least one press-on elements 796 is configured to transfer a pressure of between 1N and 100N from the cover 74 to the sidewalls 72.

Figure 4:
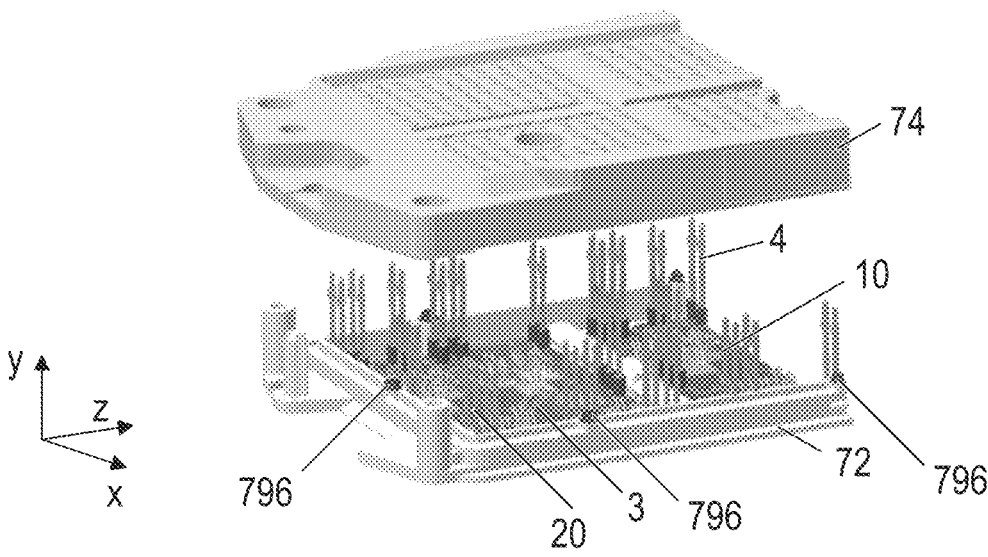
FIG. 4 is a three-dimensional view of a section of a power semiconductor module arrangement according to one example in an unmounted state.
Figure 5:
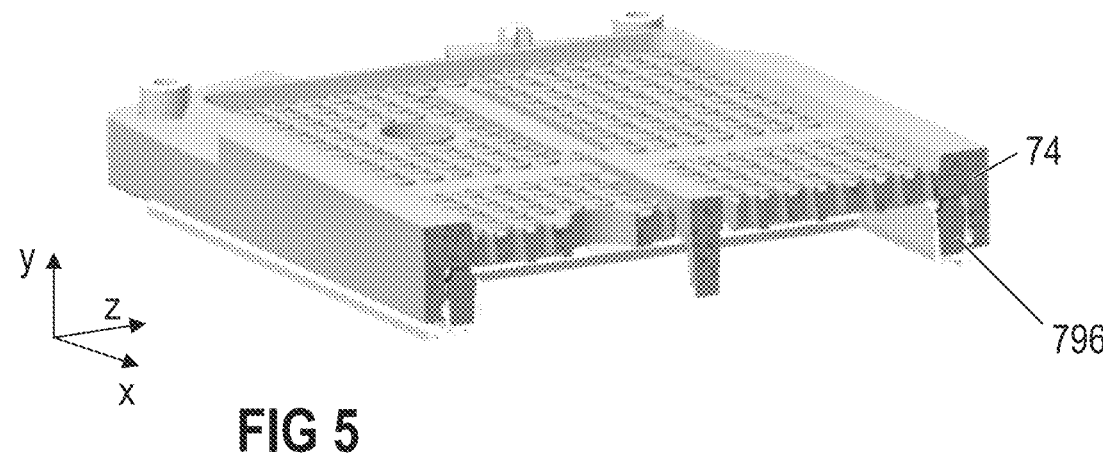
FIG. 5 is a three-dimensional view of a section of a cover of a housing according to another example.

As is exemplarily illustrated in FIG. 4, each of a plurality of press-on elements 796 can have a round cross-section. That is, each of the at least one press-on element 796 can have a cylindrical shape, for example. This, however, is only an example. The press-on elements 796 alternatively can have an angular (e.g., triangular, square, rectangular, or polygonal) or an oval cross-section, for example. Press-on elements 796 having an elongated shape are exemplarily illustrated in FIGS. 6, 7, 8 and 9. In the example illustrated in FIG. 9, the press-on elements 796 are mounted to the cover 74 instead of to the sidewalls 72 and are only partly visible, as the press-on elements 796 are partly concealed by the cover 74.

Figures 6, 7, 8, 9:
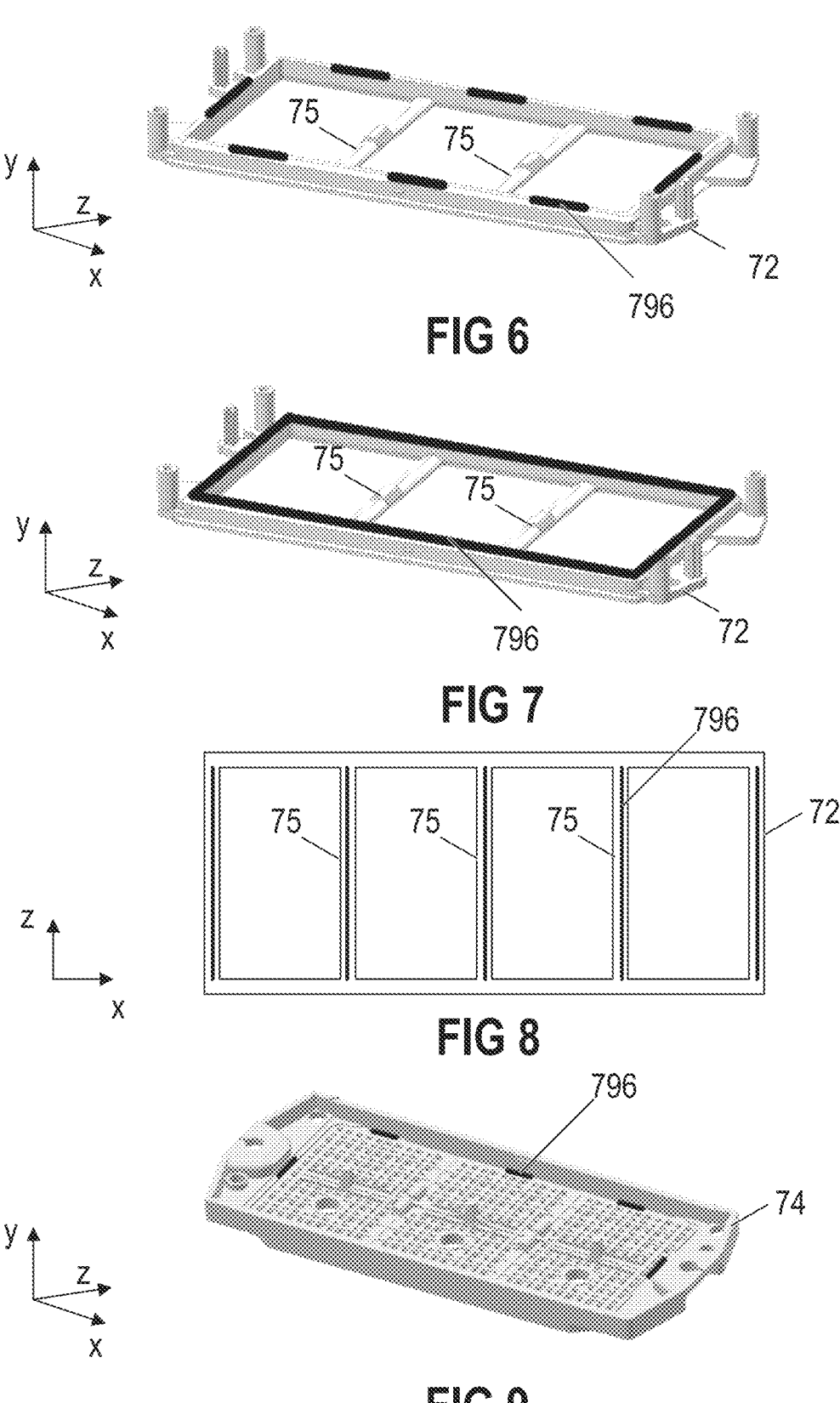
FIG. 6 is a three-dimensional view of sidewalk of a housing according to one example.
FIG. 7 is a three-dimensional view of sidewalks of a housing according to an even further example.
FIG. 8 is a top view of sidewalk of a housing according to an even further example.
FIG. 9 is a three-dimensional view of a cover of a housing according to an even further example.

In the example illustrated in FIG. 6, a plurality of elongated press-on elements 796 is evenly distributed along the circumference of the frame formed by the sidewalls 72. As has already been explained above, each of the press-on elements 796 can have another shape such as cylindrical, oval or angular. Each of the plurality of press-on elements 796 can have the same height in the vertical direction y. In this way, the cover 74, when mounted onto the sidewalls 72, contacts all of the press-on elements 796 essentially at the same time. Any differences in height merely result from unintentional manufacturing tolerances.

In the examples illustrated in the Figures, the frame formed by the sidewalls 72 has an essentially even height, and the press-on elements also have identical heights. According to another example which is not specifically illustrated, it is also possible that the height of the frame formed by the sidewalls 72 varies along its circumference. In this case it is possible that different press-on elements 796 have different heights. In any case, that side of each press-on element 796 which is arranged the furthest from the at least one substrate 10 and the heat sink 18 in the vertical direction, is arranged at the same distance from the heat sink 18, when the sidewalls 72 are arranged on the heat sink 18.

Now referring to FIG. 7, it is also possible that the arrangement comprises a single press-on element 796 extending along the entire circumference of the frame formed by the sidewalls 72 without interruption. The press-on elements 796 illustrated in FIG. 9 are similar to the press-on elements of the arrangement illustrated in FIG. 6. However, the press-on elements illustrated in FIG. 9 are arranged on the cover 74 instead of on the sidewalls 72. Now referring to the top view of sidewalls 72 of a housing illustrated in FIG. 8, it is also possible to arrange press-on elements 796 on struts 75 extending between two opposite walls of the sidewalls 72. Press-on elements 796 can be arranged on struts 75 instead of or in addition to the press-on elements 796 arranged along the circumference of the frame formed by the sidewalls 72.

Figures 10, 12:
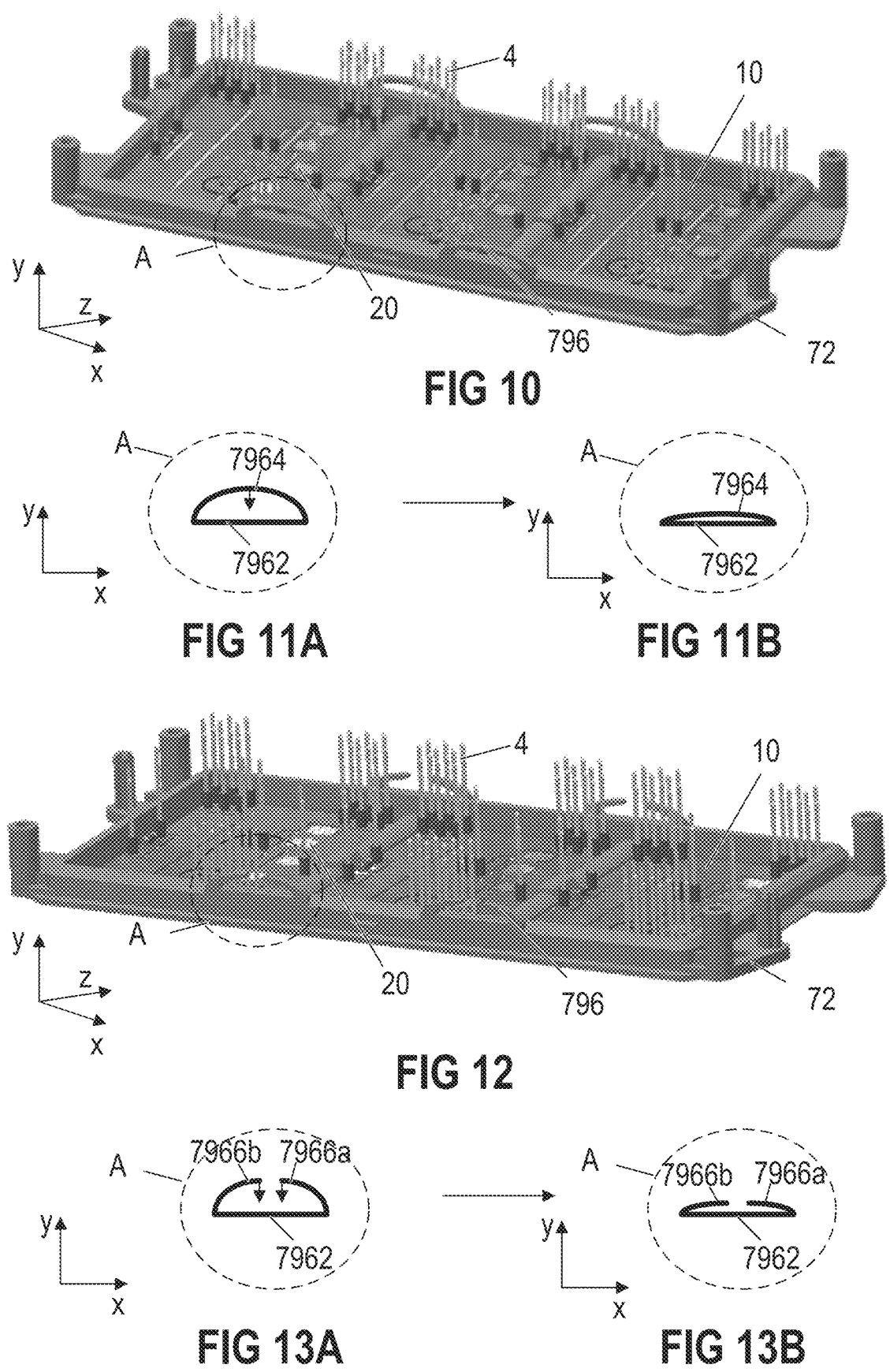
FIG. 10 is a three-dimensional view of sidewalls of a housing according to an even further example.
FIG. 12 is a three-dimensional view of sidewalls of a housing according to an even further example.

In the examples described above, the press-on elements 796 comprise a compressible material. This, however, is only an example. According to another example, a compression of the press-on elements 796 may result from a structural shape of the press-on elements 796. That is, the material of the press-on element 796 by itself may not be compressible, or may be compressible only marginally. However, the press-on element 796 may be bent or distorted under pressure. An example of such a press-on element 796 is schematically illustrated in FIGS. 10 and 11. The press-on elements 796 as illustrated in FIGS. 10 and 11 comprise a base section 7962 and an arch-shaped section 7964 coupled to the base section 7962. In particular, a first end of the arch-shaped section 7964 is coupled to a first end of the base section 7962, and a second end of the arch-shaped section 7964 is coupled to a second end of the base section 7962. A middle section of the arch-shaped section 7964 extends and forms an arch between the first end and the second end. FIG. 11A schematically illustrates one press-on element 796 in greater detail. As is schematically illustrated in FIG. 11B, when pressure is exerted on the press-on element 796, the arch-shaped section 7964 is pressed towards the base section 7962.

In the example illustrated in FIGS. 12 and 13, the arch-shaped section is interrupted at its topmost point. That is, a first curved brace 7966a extends from the first end of the base section 796:2 towards a second curved brace 7966b. The second curved brace 7966b in turn extends from the second end of the base section 7962 towards the first curved brace 7966a. The first curved brace 7966a and the second curved brace 7966b, however, do not contact each other. As is illustrated in FIG. 13B, the curved braces 7966a, 7966b are bent towards the base section 7962 when pressure is exerted on the press-on element 796. FIG. 13A illustrates the press-on element 796 in an initial state when no pressure is exerted on the press-on element 796.

The press-on elements 796 illustrated in FIGS. 10 to 13B, however, are only examples. The press-on elements 796 can have any other suitable shape that allows the press-on element 796 to be bent or distorted under pressure. For example, the at least one press-on element 796 can comprise any kind of spring element.

The press-on elements 796 can be firmly or detachably attached to either the sidewalls 72 or the cover 74. For example, the press-on elements 796 can be formed directly on the sidewalls 72 or the cover 74 by any kind of injection molding process. It is, however, also possible to manufacture the press-on elements 796 separately. The press-on elements may then be fixed to the sidewalls 72 or the cover 74 in any suitable way. For example, the press-on elements 796 can be glued to the sidewalls 72 or the cover 74, or can be inserted into corresponding slots or cavities formed in the sidewalls 72 or in the cover 74.

In the examples described above, the at least one substrate 10 and the sidewalls 72 of the housing are directly mounted to a heat sink 18. This, however, is only an example. It is also possible that a base plate is arranged between the at least one substrate, the housing and the heat sink, That is, the at least one substrate 10 may be pressed onto the base plate by means of the housing. The base plate may be attached to a heat sink.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module arrangement, comprising:
   a housing;
   at least one substrate arranged inside the housing and comprising a dielectric insulation layer and a first metallization layer arranged on a first side of the dielectric insulation layer; and
   a heat sink or base plate,
   wherein:
      the housing comprises sidewalls and a cover;
      the housing is attached to the heat sink or base plate;
      the sidewalls of the housing exert pressure on the at least one substrate such that the at least one substrate is pressed onto the heat sink or base plate;
      the cover exerts pressure on the sidewalls such that the sidewalls are pressed onto the at least one substrate;
      the housing further comprises at least one press-on element arranged between and directly adjoining the sidewalls and the cover; and each of the at least one press-on element is compressed by the pressure that is exerted on the sidewalls by the cover.

2. The power semiconductor module arrangement of claim 1, wherein the sidewalls form a closed frame extending along an outer circumference of the at least one substrate, and wherein the power semiconductor module arrangement comprises one press-on element extending continuously around the entire circumference of the frame formed by the sidewalls.

3. The power semiconductor module arrangement of claim 1, wherein the sidewalls form a closed frame extending along an outer circumference of the at least one substrate, and wherein the power semiconductor module arrangement comprises two or more press-on elements evenly distributed along the circumference of the frame formed by the sidewalls.

4. The power semiconductor module arrangement of claim 1, wherein each of the at least one press-on element is configured to transfer a force of between 1 N and 100 N from the cover to the sidewalls.

5. The power semiconductor module arrangement of claim 1, wherein each of the at least one press-on element is firmly or detachably attached either to the sidewalls, or to the cover.

6. The power semiconductor module arrangement of claim 1, wherein the at least one press-on element has a hardness of between 15 Shore A and 100 Shore A.

7. The power semiconductor module arrangement of claim 1, wherein the at least one press-on element comprises at least one of a thermoplastic elastomer, silicone, and rubber.

8. The power semiconductor module arrangement of claim 7, wherein the at least one press-on element comprises ethylene propylene diene monomer rubber (EPDM), ethylene acrylic rubber (AEM), acrylic rubber or alkyl acrylate copolymer (ACM), fluorine rubber or fluorocarbon (FKM), silicone rubber or vinyl methyl silicone (VMQ), fluorosilicone rubber or fluorovinylmethylsiloxane rubber (FVMQ), phenyl methyl silicone rubber (PVMQ), or a perfluoroelastomeric compound having a higher amount of fluorine than FKM (FFKM).

9. The power semiconductor module arrangement of claim 1, wherein the at least one press-on element is injection molded on the sidewalls or the cover.

10. The power semiconductor module arrangement of claim 1, wherein either the at least one press-on element is glued to the sidewalls or the cover, or each of the at least one press-on element is inserted into a corresponding slot or cavity formed in the sidewalls or in the cover.

11. The power semiconductor module arrangement of claim 1, wherein each of the at least one press-on element comprises a structural shape that is configured to be bent or distorted under pressure.

12. The power semiconductor module arrangement of claim 11, wherein each of the at least one press-on element comprises a base section and an arch-shaped section coupled to the base section, and wherein a first end of the arch-shaped section is coupled to a first end of the base section, a second end of the arch-shaped section is coupled to a second end of the base section, and a middle section of the arch-shaped section extends and forms an arch between the first end and the second end.

13. The power semiconductor module arrangement of claim 11, wherein each of the at least one press-on element comprises a base section, and a first curved brace extending from a first end of the base section towards a second curved brace, and wherein the second curved brace extends from a second end of the base section towards the first curved brace.

14. A method, comprising:
- arranging at least one substrate on a heat sink or base plate, wherein each of the at least one substrate comprises a dielectric insulation layer and a first metallization layer arranged on a first side of the dielectric insulation layer;
- arranging a housing on the heat sink or base plate, wherein the housing comprises sidewalls, a cover, and at least one press-on element,
- wherein arranging the housing on the heat sink or base plate comprises:
  - arranging the sidewalls on the at least one substrate such that the sidewalls extend along an outer circumference of the at least one substrate;
  - arranging the cover on the sidewalls such that the at least one press-on element is arranged between and directly adjoins the sidewalls and the cover; and

- attaching the housing to the heat sink or base plate,
- wherein when the housing is attached to the heat sink or base plate, the sidewalls of the housing exert pressure on the at least one substrate such that the at least one substrate is pressed onto the heat sink or base plate, the cover exerts pressure on the sidewalls such that the sidewalls are pressed onto the at least one substrate, and each of the at least one press-on element is compressed by the pressure that is exerted on the sidewalls by the cover.

15. A housing, comprising:

sidewalls;

a cover; and at least one press-on element arranged between and directly adjoining the sidewalls and the cover, wherein each of the at least one press-on element is compressed when pressure is exerted on the sidewalls by the cover.

* * * * *